United States Patent [19]
Glenn, Sr. et al.

[11] Patent Number: 5,345,199
[45] Date of Patent: Sep. 6, 1994

[54] NON-REFLECTIVE LIMITER

[75] Inventors: Chance M. Glenn, Sr., Columbia; Roger Kaul, Olney; David Sumner, Adelphi; Kisha N. Gwyn, Silver Spring, all of Md.

[73] Assignee: The United States of America as represented by the Secretary of the Army, Washington, D.C.

[21] Appl. No.: 105,270

[22] Filed: Aug. 12, 1993

[51] Int. Cl.$^5$ ................................ H01P 1/22
[52] U.S. Cl. .................... 333/17.2; 333/81 A
[58] Field of Search ............. 333/17.2, 81 R, 81 A

[56]  References Cited
    U.S. PATENT DOCUMENTS

| | | | |
|---|---|---|---|
| 3,289,120 | 11/1966 | Anders et al. | 333/81 R |
| 3,568,099 | 4/1969 | Chao | 333/17.2 |
| 4,255,724 | 3/1981 | Bergero | 333/17.2 |
| 5,126,701 | 6/1992 | Adlerstein | 333/17.2 |
| 5,262,741 | 11/1993 | Kitakubo | 333/81 A |

OTHER PUBLICATIONS

"Theoretical and Experimental Study of a Non-Reflective Limiter" Aug. 14, 1992 Kisha N. Gwyn SEAP Holton Arms School: Chance M. Glenn Mentor RF Effects and Hardening Technology Branch.

"Design of a Limiting Attenuator" Aug. 24, 1992; 6th National High Powered Microwave Symposium Digest; chance M. Glenn Sr. Roger Kaul and David A. Sumner.

Primary Examiner—Paul Gensler
Attorney, Agent, or Firm—Freda L. Krosnick; Frank J. Dynda

[57] ABSTRACT

A passive RF limiting circuit device providing protection for receiver front ends and the like by utilizing PIN diodes acting as switching devices which transform a low-loss T-network attenuator circuit into a high-loss $\pi$-network attenuator circuit under high power conditions.

6 Claims, 8 Drawing Sheets

NON-REFLECTIVE LIMITER

RIGHTS OF THE GOVERNMENT

The invention described herein may be manufactured, used and licensed by or for the United States Government for Governmental purposes without payment to us of any royalty thereon.

BACKGROUND OF THE INVENTION

1. Field of the Invention

The present invention relates to the protection of Radio Frequency (RF) receiving and/or transmitting equipment from undesired RF signals which are of sufficient energy-levels to upset and/or damage them. The invention limits the undesired signal levels to sufficiently low levels to prevent damage and/or upset of the system being protected. The invention does not reflect a significant amount of the undesired signal and so is applicable to low-observable systems. The term limiter includes receiver protection device and terminal protective device.

2. Description of the Prior Art

There is a well established need to protect front-door microwave components from intense RF energy. Front-door microwave components are those components located along intentional RF receiving and transmitting paths connected to an antenna in an RF system. Conventional limiter technology takes advantage of a conditional short to ground which serves to reflect the unwanted energy back towards the source. This situation is undesirable for low-observable platforms, because the energy reflected from the limiter makes the platform observable when illuminated by an intense signal (such as an intense radar signal or high power microwave signal).

This is also an undesirable situation for diagnostic equipment such as oscilloscopes, spectrum analyzers, etc. There is a need for this equipment to be protected from incidental transients, however thse transients must not be reflected towards the source. Present limiter technology does not have the ability to solve both of these problems.

Accordingly, it is an object of this invention to provide a limiter that distributes power to the linear and non-linear resistive elements within it, thus providing a limiter with a high burnout threshold.

It is also another object of this invention to provide a limiter with low insertion loss, that is small in size, and that requires little or no power from the system.

SUMMARY OF THE INVENTION

Briefly, the foregoing and other objects are achieved by a passive limiting device that provides as much as 25 dB of protection and 30 dB of return loss. PIN diodes in the limiting device act as switching devices which cause a low-loss T network attenuator circuit to switch into a high-loss $\pi$-network attenuator circuit.

BRIEF DESCRIPTION OF THE DRAWINGS

A better understanding of the invention will be obtained when the following detailed description of the invention is considered in connection with the accompanying drawings in which.

DETAILED DESCRIPTIONS OF SPECIFIC EMBODIMENTS

Figure 1:
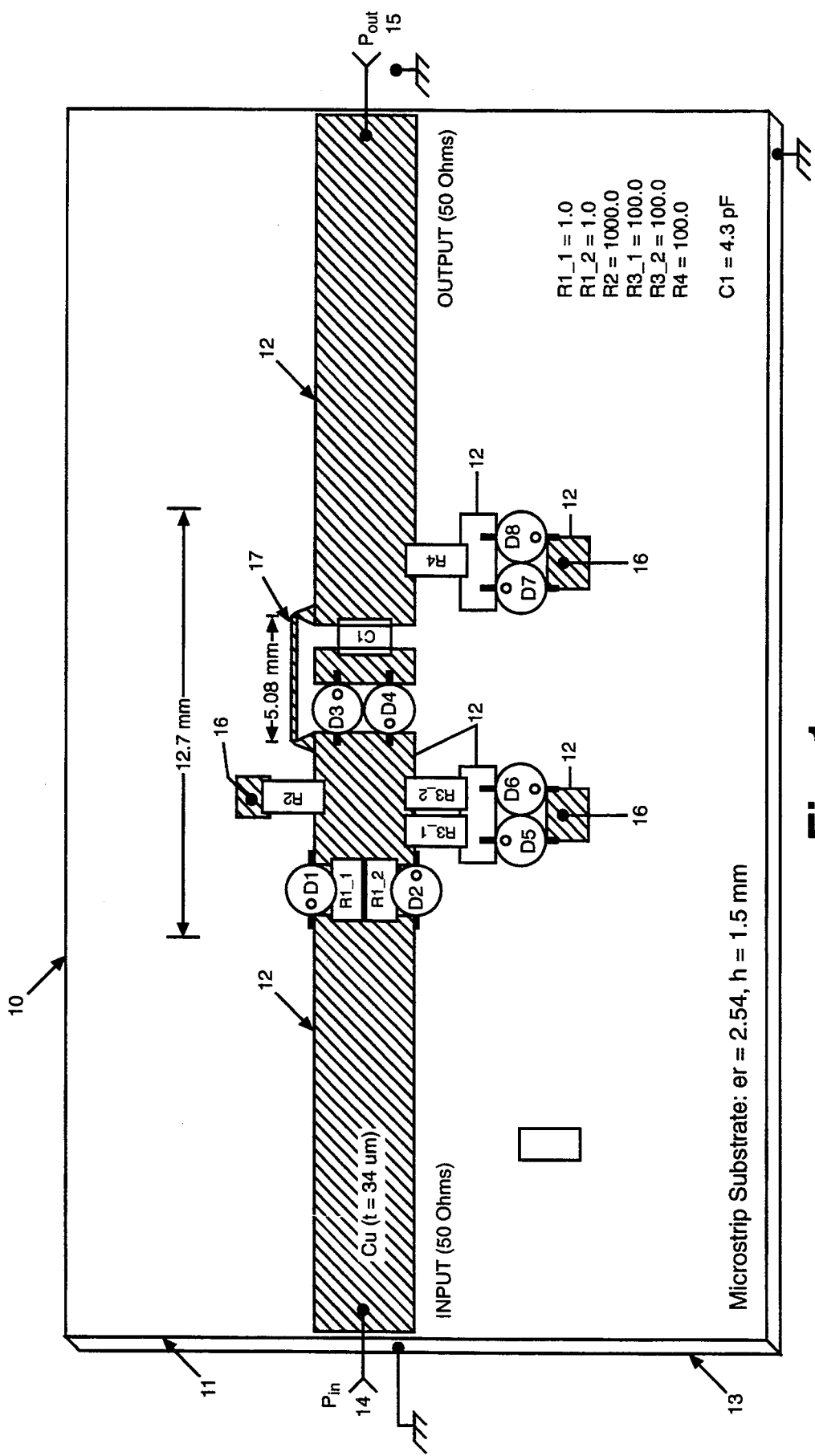
FIG. 1 shows the microstrip version of the passive non-reflective limiter.

Referring to the drawings, FIG. 1 is a top view of a microstrip version of a passive non-reflective limiter prototype (PNRL) 10. This prototype is fabricated on a 1.5 millimeter thick substrate 11 which has a relative dielectric constant ($\epsilon_r$) of 2.54. The signal line plane 12 and the ground plane 13 are made of copper 34 micrometers thick. Both the input port 14 and the output port 15 are matched to 50 ohms when the limiter 10 is in both the off and on states. Diodes D1 through D8 are type MA4L022-137 silicon PIN diodes. Each diode needs to see about 0.7 volts to begin the transition from a high impedance (1 megohm) to a low impedance (1 ohm).

Figure 2:
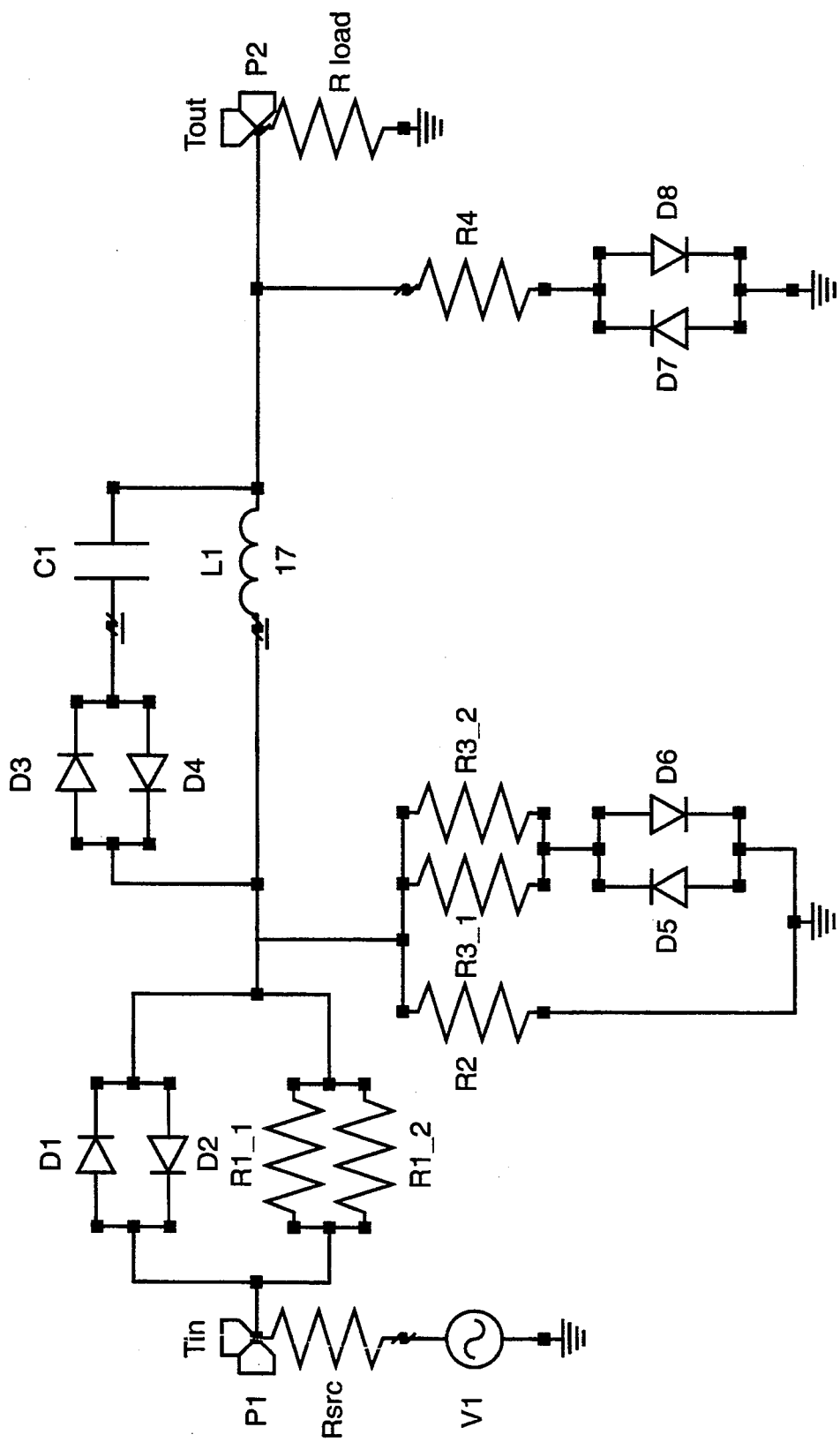
FIG. 2 shows a schematic diagram of the passive non-reflective limiter.

FIG. 2 is a schematic diagram of the passive version of the non-reflective limiter. The switching devices cause the circuit to transition from an attenuator of low value in the off state to an attenuator of high value in the on state. It is seen that in the off state the circuit becomes a T-network attenuator with the inductor $L_1$ 17 providing a finite and relatively low impedance at 1 Gigahertz. In the on state the circuit becomes a $\pi$-network attenuator as the $L_1C_1$ resonant tank circuit provides a high impedance at 1 Gigahertz.

Figure 3:
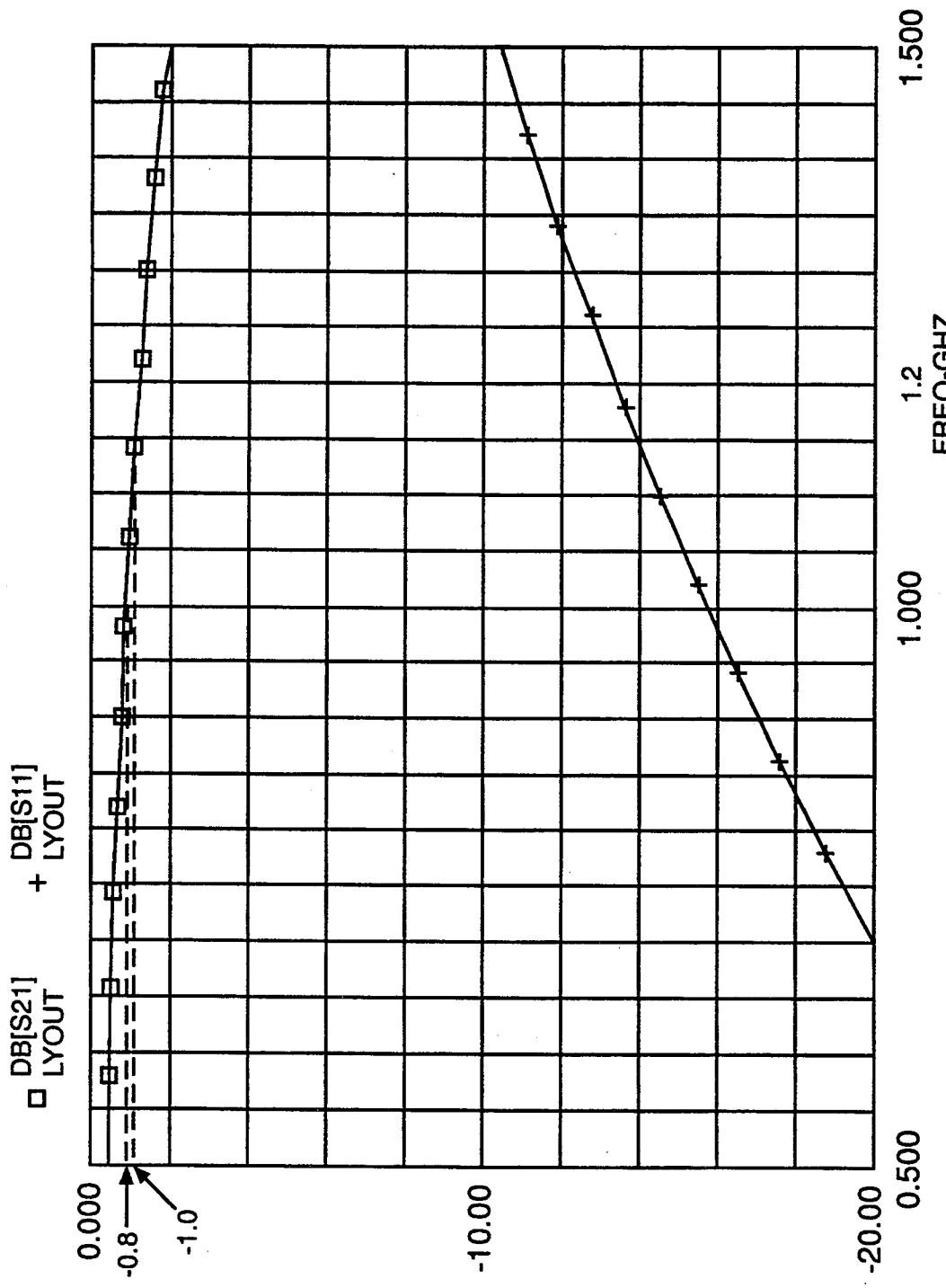
FIG. 3 shows the off-state frequency response for the passive non-reflective limiter.
Figure 4:
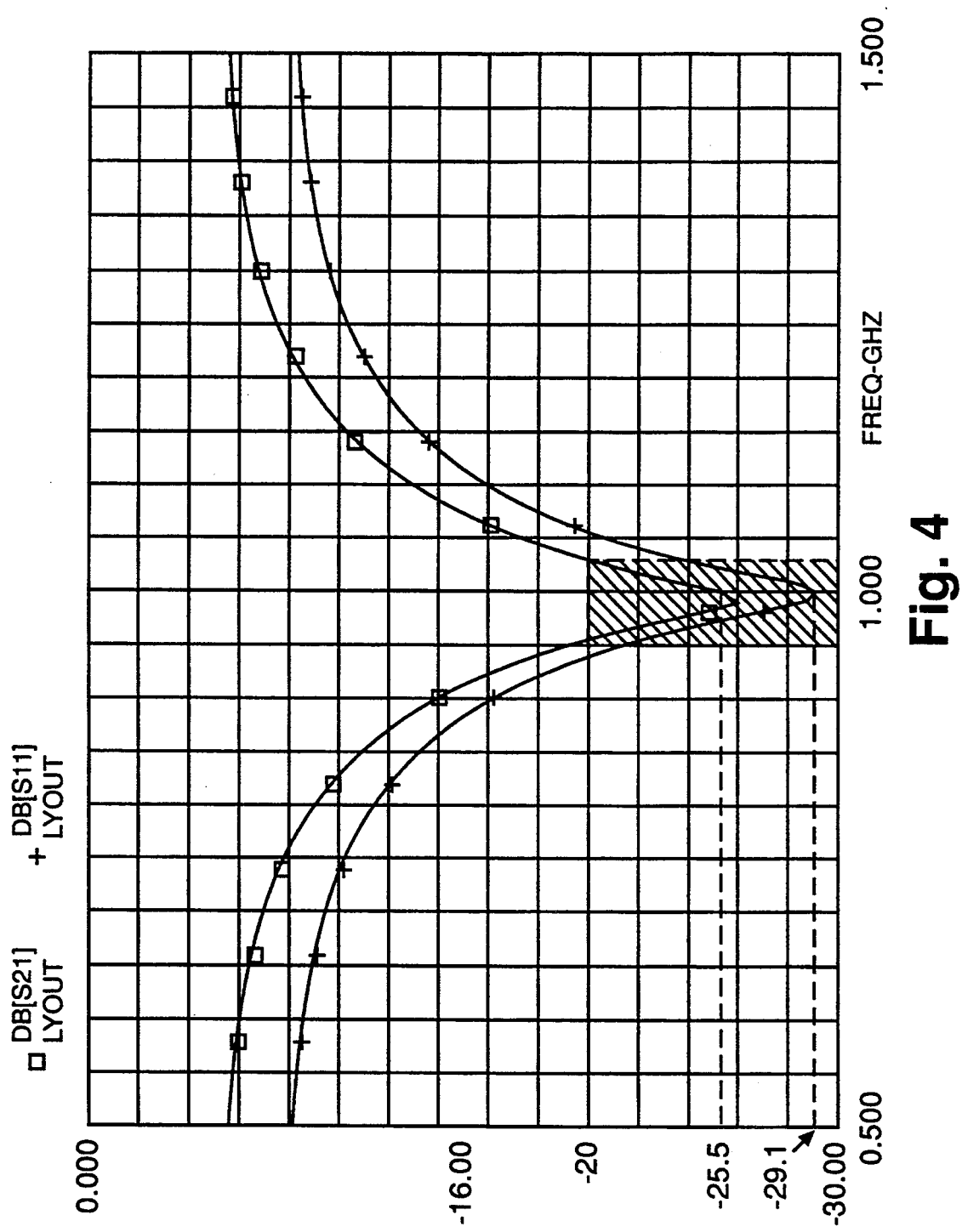
FIG. 4 shows the on-state frequency response for the passive non-reflective limiter.

FIG. 3 shows a state 0 or diodes off frequency response plot generated by a computer simulation of the microstrip layout of FIG. 1. The circuit 10 yields less than 1 dB of insertion loss from DC up to 1.2 Gigahertz. FIG. 4 is a state 1 or diodes on frequency response plot generated by the same computer program for the same circuit. The circuit provides better than 25 dB of isolation and 29 dB of return loss at 1 Gigahertz. This circuit will operate over an 80 Megahertz bandwidth with better than 25 dB of isolation and 29 dB of return loss at 1 Gigahertz.

Figure 5:
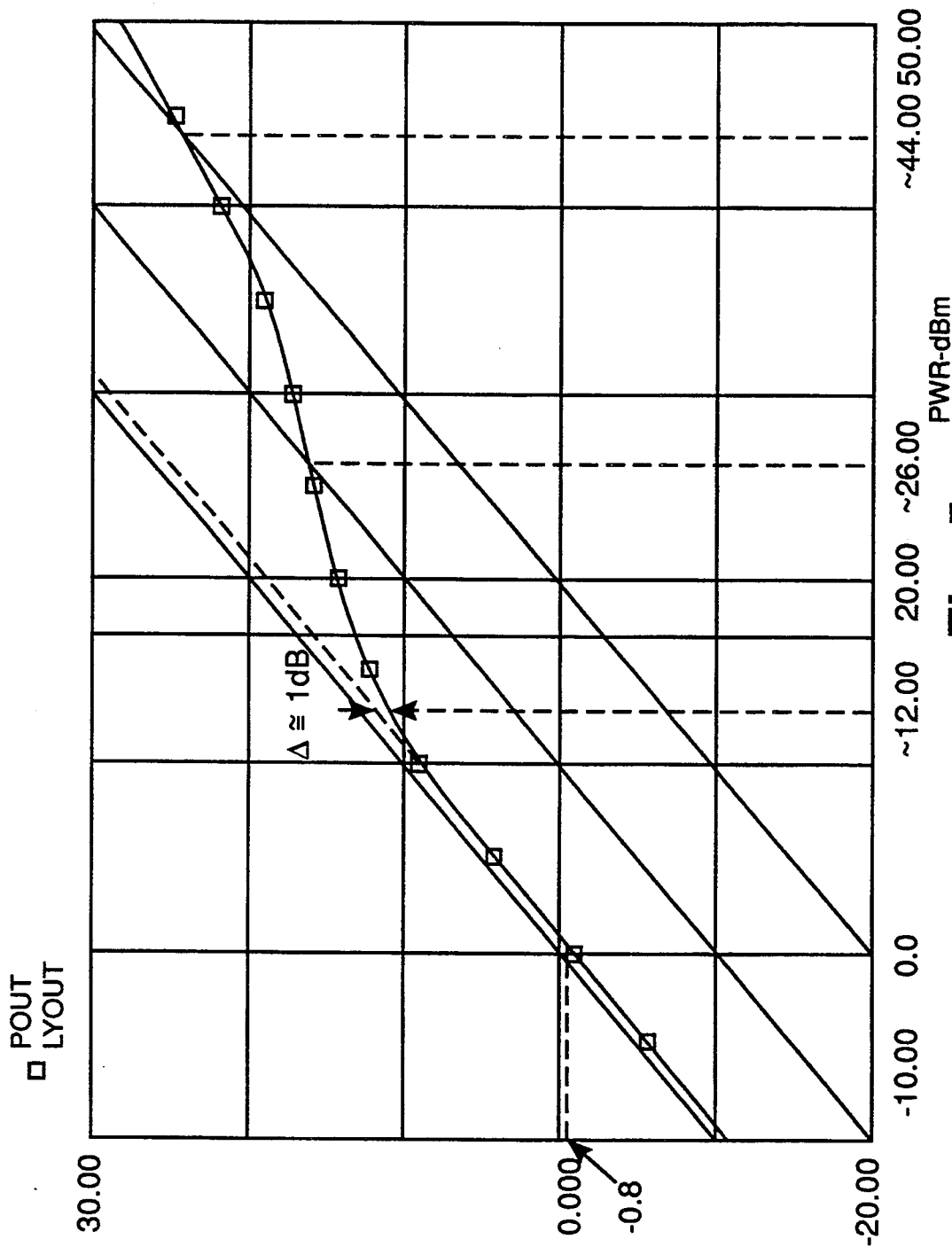
FIG. 5 shows a simulated power characteristics plot of the passive non-reflective limiter.

FIG. 5 shows the power in/power out characteristics of the passive non-reflective limiter 10 as simulated by a computer. The computer took into account the non-linear I-V characteristics of the PIN diodes D1 through D8. The plot shows the initial insertion loss of approximately 0.8 dB when the input power is still below the turn-on threshold. The 1 dB compression point is a figure of merit which is used to determine the onset of non-linearity in a circuit. The device begins to turn on at approximately 12 dBm (398 mW) and 20 dB of isolation is provided at an input power of 44 dBm (25.1 W). By varying circuit element values and the types of switches, the turn-on threshold can be adjusted.

Figure 6:
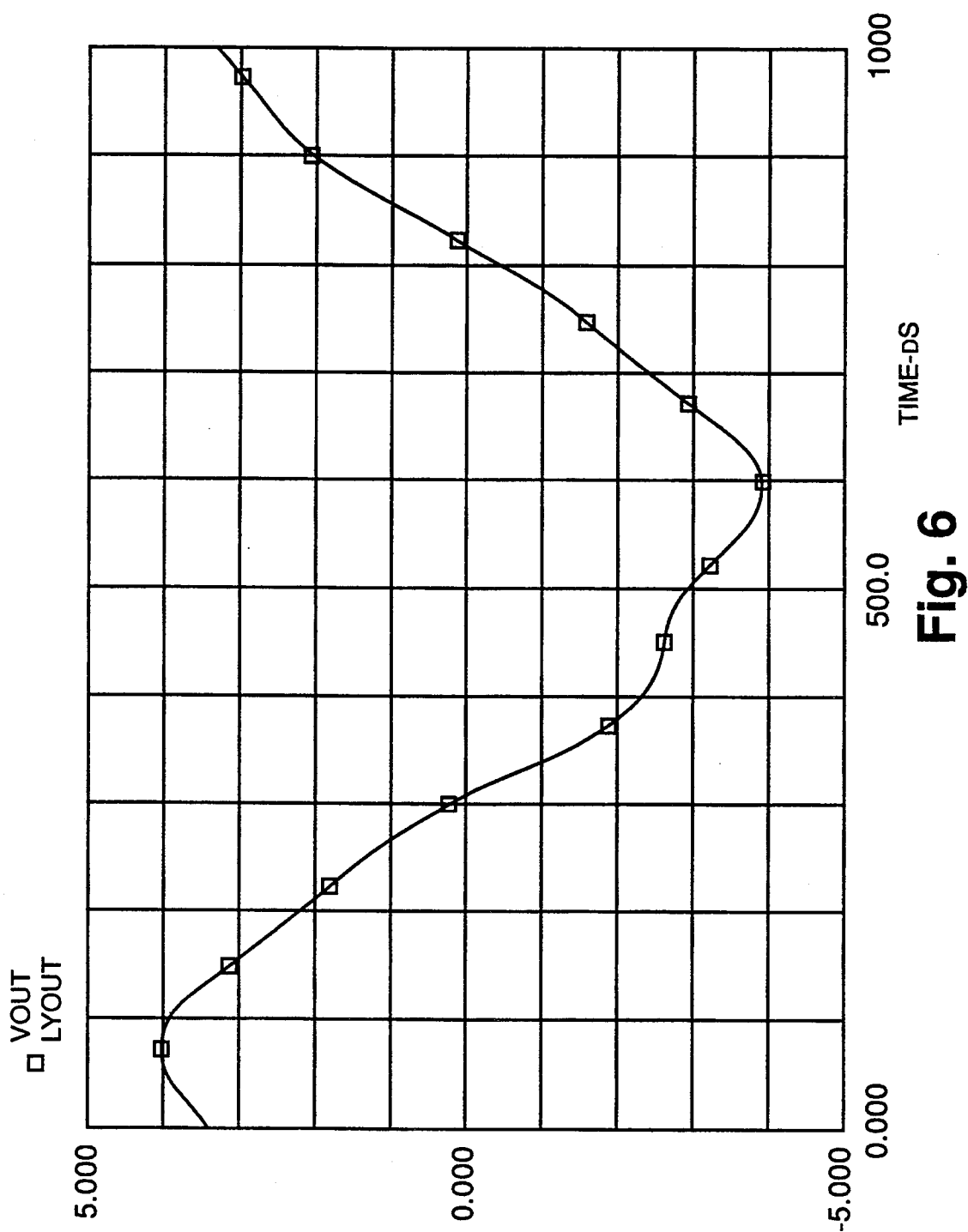
FIG. 6 shows simulation results for the output voltage waveform of the passive non-reflective limiter.
Figure 7:
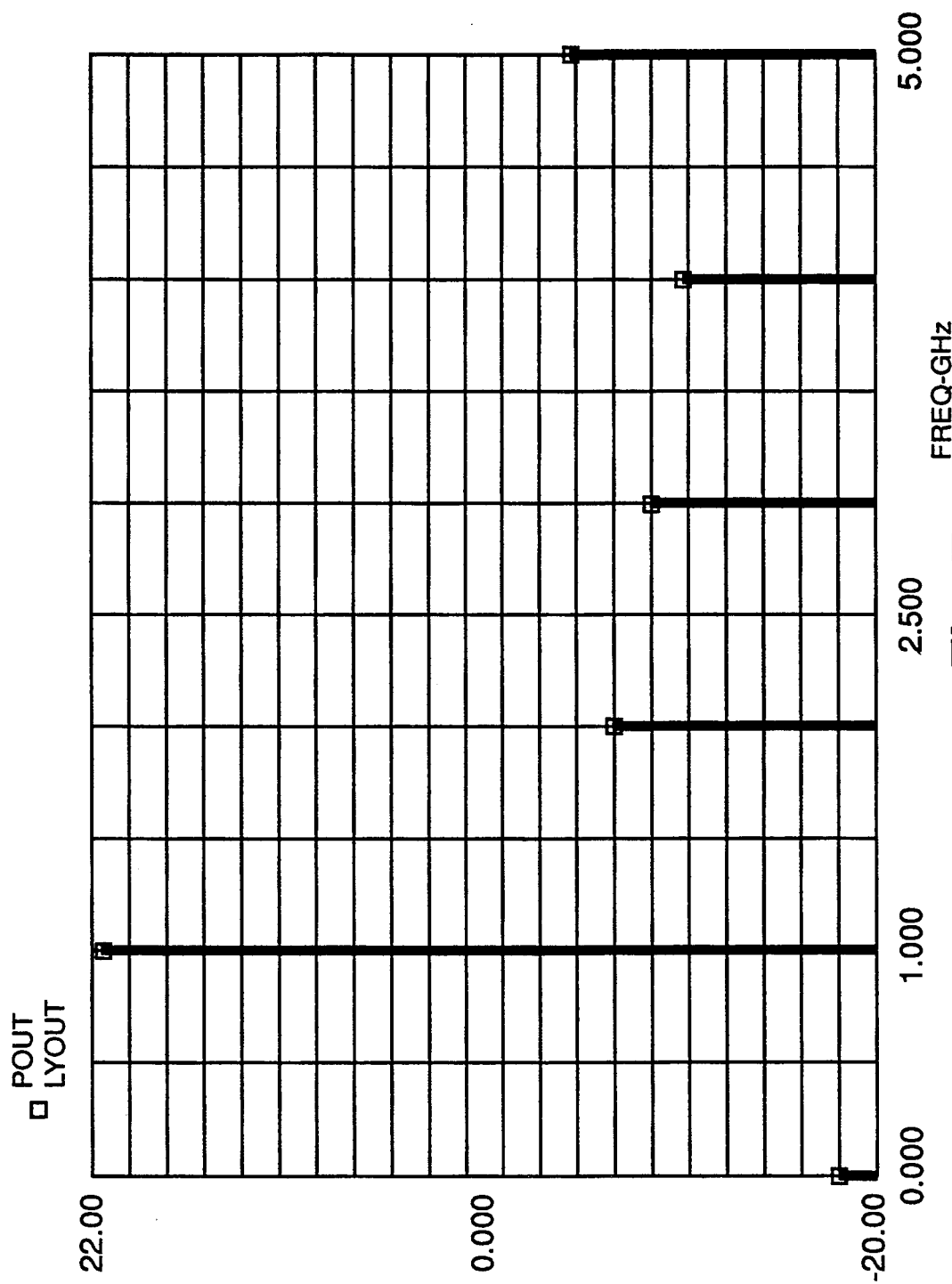
FIG. 7 shows the frequency content of the output waveform of FIG. 6.

FIG. 6 is the simulation result for the output voltage-time waveform of the passive non-reflective limiter for a 1 Gigahertz, 40 dBm (10 W) input signal. The spectral content of this output waveform is showm in FIG. 7. The fundamental frequency (1 Gigahertz) component is significantly higher than any of the upper harmonics. The major portion of the output power is concentrated in the fundamental frequency.

Figure 8:
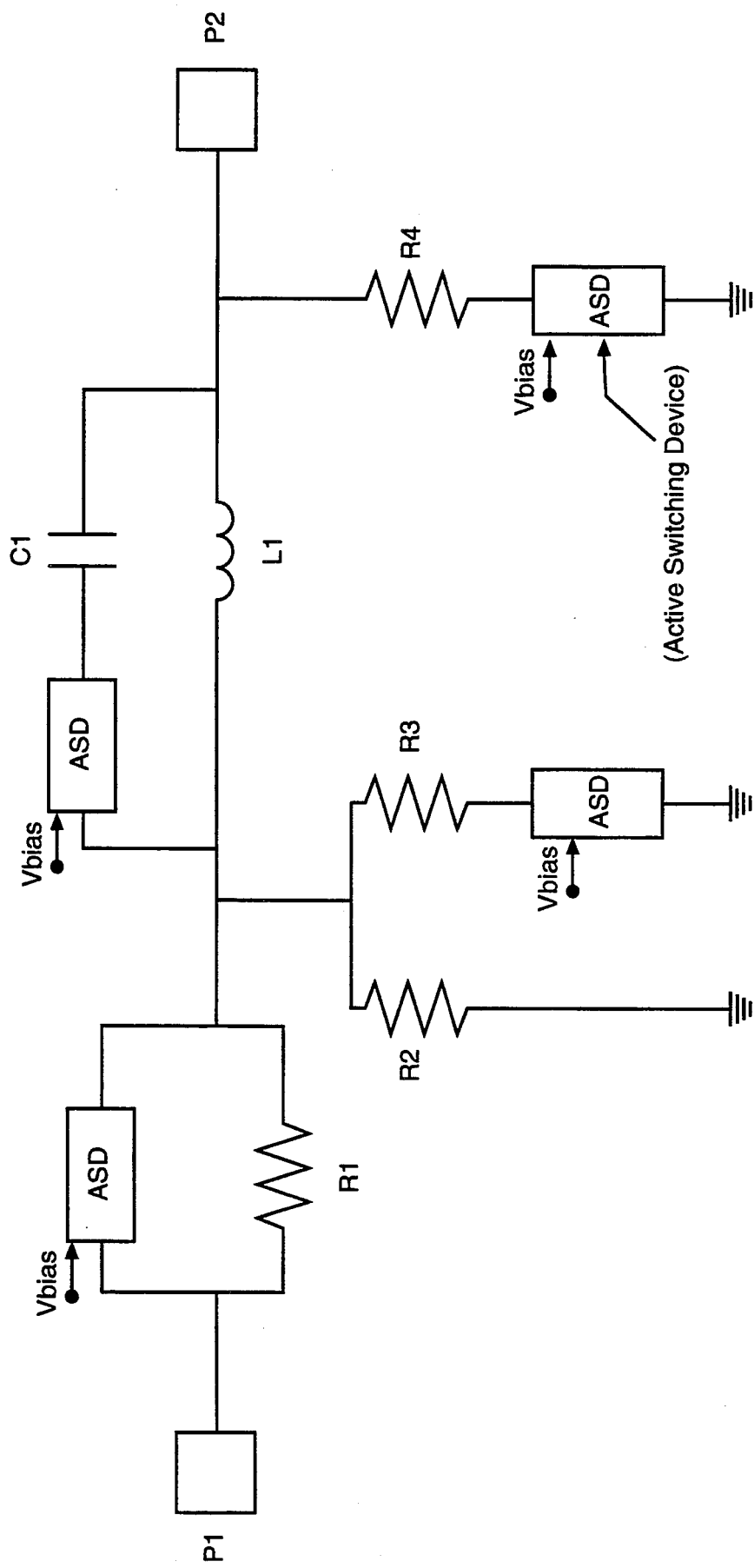
FIG. 8 shows an implementation using active switching.

An active switching device with external controls adds additional flexibility to the design. This control can set the threshold for the on-state and can activate the on-state prior to the arrival of the strong signal. Typical active switching devices are metal semiconductor field-effect transistors, heterojunction bipolar transistors, etc. A circuit configuration with such devices is shown in FIG. 8.

What is claimed is:

1. A passive limiting device comprising:
   an input port,
   a first end of a first resistance connected to said input port,
   an inductance element connected between the second end of said first resistance and an output port,
   a second resistance connected between the second end of said first resistance and a ground reference,
   a third resistance connected in series with a first pair of diodes connected anode to cathode in parallel, said third resistance in series with said first pair of diodes being connected between said output port and said ground reference,
   a fourth resistance in series with a second pair of diodes connected anode to cathode in parallel, said fourth resistance and said second pair of diodes being connected in parallel across said second resistance,
   a third pair of diodes connected anode to cathode in parallel, said third pair of diodes being connected in series with a capacitance, and wherein said third pair of diodes in series with said capacitance is connected in parallel with said inductance,
   a fourth pair of diodes connected anode to cathode in parallel, said fourth pair of diodes being connected in parallel with said first resistance, wherein
   when said first, second, third, and fourth pairs of diodes are open circuited, said passive limiting device comprises a low-loss T-network attenuator circuit, and when said first, second, third, and fourth pairs of diodes are conducting, said passive limiting device comprises a high-loss $\pi$-network attenuator circuit.

2. A passive limiting device as in claim 1, wherein said pairs of diodes are PIN diodes.

3. A passive limiting device as in claim 1, wherein said inductance comprises a portion of a conducting film on a microcircuit substrate.

4. A passive limiting device as in claim 1, wherein said input port and said output port are matched to 50 ohms.

5. A passive limiting device as in claim 1, wherein said inductance and said capacitance comprise a resonant tank circuit at a frequency of operation when said third pair of diodes are in an on-state.

6. A passive limiting device as in claim 1, wherein said first, second, third, and fourth resistances are power absorbing resistances.

* * * * *